United States Patent [19]

Kondou et al.

[11] Patent Number: 5,083,056
[45] Date of Patent: Jan. 21, 1992

[54] DISPLACEMENT GENERATING APPARATUS

[75] Inventors: Yuu Kondou; Tomio Ono, both of Yokohama, Japan

[73] Assignee: Kabushiki Kaisha Toshiba, Kawasaki, Japan

[21] Appl. No.: 480,007

[22] Filed: Feb. 14, 1990

[30] Foreign Application Priority Data

Mar. 14, 1989 [JP] Japan .................... 1-61635

[51] Int. Cl.⁵ ............................................ H01L 41/08
[52] U.S. Cl. ...................................... 310/332; 310/317; 310/330; 310/331
[58] Field of Search ................ 310/330, 331, 332, 317

[56] References Cited

U.S. PATENT DOCUMENTS

| | | | |
|---|---|---|---|
| 4,188,645 | 2/1980 | Ragle et al. | 310/331 |
| 4,359,892 | 11/1982 | Schnell et al. | 310/332 |
| 4,851,871 | 7/1989 | Ooe et al. | 310/330 |
| 4,885,498 | 6/1986 | Wakita | 310/328 |
| 4,907,123 | 3/1990 | Taniguchi et al. | 310/330 |
| 4,978,881 | 12/1990 | Wakita et al. | 310/328 |

FOREIGN PATENT DOCUMENTS

| | | | |
|---|---|---|---|
| 0147112 | 7/1985 | European Pat. Off. | |
| 2852795 | 6/1979 | Fed. Rep. of Germany | 310/332 |
| 2811783 | 9/1979 | Fed. Rep. of Germany | 310/331 |
| 0208433 | 5/1984 | Fed. Rep. of Germany | 310/332 |
| 0151077 | 9/1983 | Japan | 310/332 |
| 0175777 | 10/1984 | Japan | 310/332 |
| 0186380 | 10/1984 | Japan | 310/332 |
| 0222976 | 12/1984 | Japan | 310/332 |
| 0178677 | 9/1985 | Japan | 310/332 |
| 0058482 | 3/1986 | Japan | |
| 0139284 | 6/1986 | Japan | 310/317 |
| 0141789 | 6/1987 | Japan | |

OTHER PUBLICATIONS

Journal of the Japan Hydraulics & Pneumatics Society (Yuato to Kukiatu); "A High-Speed Electro-Hydraulic Servovalve Using a PMN Electrostrictor", H. Ohuchi, et al, 1986, pp. 74-80.

Japanese Journal of Applied Physics, vol. 21, No. 7; "The Electrostrictive Unimorph for Displacement Control"; K. Abe, K. Uchino, S. Nomura; 1982.

Primary Examiner—Steven L. Stephan
Assistant Examiner—Thomas M. Dougherty
Attorney, Agent, or Firm—Oblon, Spivak, McClelland, Maier & Neustadt

[57] ABSTRACT

An electrostriction actuator comprises upper and lower electrostriction boards, having electrodes individually on either side thereof, and a conductive shim interposed between the inside electrodes. The actuator has a fixed end at one end thereof and a free end for bending movement at the other end. An amplifier for supplying driving voltage to the actuator is an inverted amplifier, whose output terminal is connected to the shim, so that an output voltage is supplied to the inside electrodes. The outside electrode of the upper electrostriction board is connected to a power source (not shown) for supplying constant voltage to the amplifier, and the outside electrode of the lower electrostriction board is connected to a power source (not shown) for supplying constant voltage to the amplifier.

5 Claims, 4 Drawing Sheets

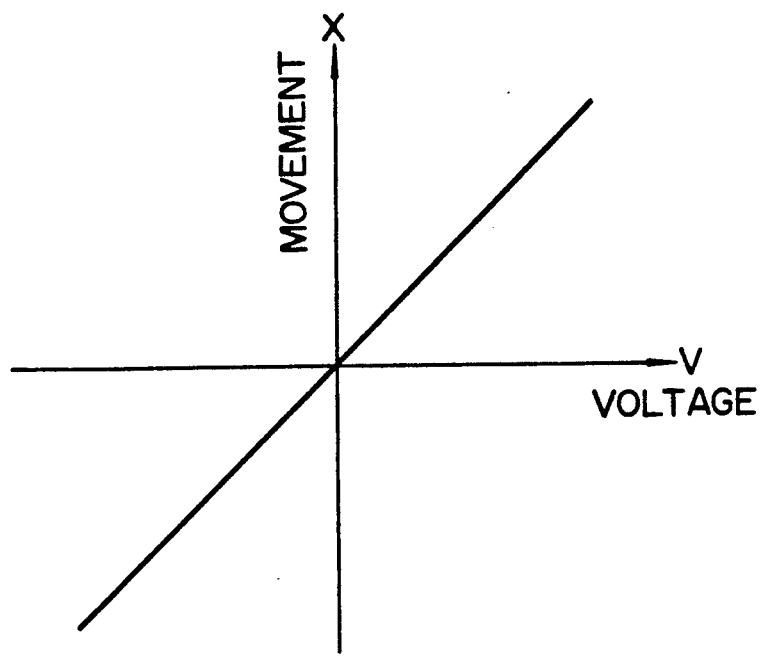
F I G. 3
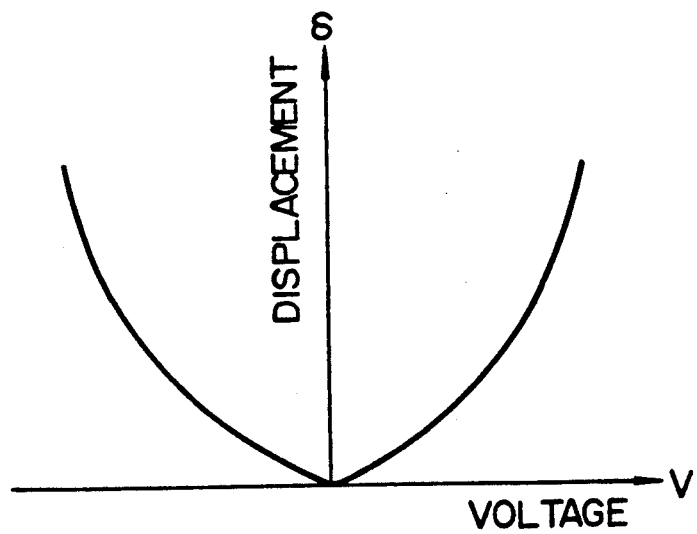
F I G. 4

DISPLACEMENT GENERATING APPARATUS

BACKGROUND OF THE INVENTION

1. Field of the Invention

The present invention relates to a displacement generating apparatus using a bimorph-type electrostriction actuator, and more particularly, to an improvement of a method for driving an electrostriction actuator.

2. Description of the Related Art

With the progress of mechatronics, fine displacement control has recently started to be regarded as important. Laminate actuators formed of piezoelectric elements are used in applications which require a very fine displacement. A bimorph-type piezoelectric actuator, which is formed of two piezoelectric boards pasted together, is used for an application which does not require such control of a fine displacement as the laminate actuator needs, but requires a displacement of several hundreds of micrometers or thereabout.

In the bimorph-type piezoelectric actuator constructed in this manner, the hysteretic characteristic of the piezoelectric material itself is reflected in the movement of the distal end portion of the actuator caused by bending, and the relationship between voltage and movement has hysteresis. Thus, although position control utilizing the maximum movement position can be effected relatively accurately, analog position control utilizing an intermediate position of the piezoelectric body on the way to its maximum movement is a very hard task.

Disclosed in Published Examined Japanese Patent Application No. 54-29359 or the like is a method in which hysteresis is suppressed by means of a sensor. In this case, however, the apparatus inevitably has a complicated construction.

On the other hand, electrostriction material has no hysteresis, and its voltage-displacement characteristic is linear. Since the electrostriction material is displaced in proportion to the square of the voltage, however, it never contracts even if a voltage of the opposite direction is applied thereto. In contrast with the conventional method, therefore, a bimorph system is proposed in which displacement control is effected by changing a predetermined voltage previously applied to electrodes on either side of an electrostriction board. There is a demand for the development of a circuit for efficiently driving a bimorph element.

SUMMARY OF THE INVENTION

The object of the present invention is to provide a displacement generating apparatus using a bimorph-type electrostriction actuator, more specifically, a displacement generating apparatus with a circuit for efficiently driving an electrostriction actuator.

A displacement generating apparatus according to one aspect of the present invention comprises: an electrostriction actuator of a bimorph structure having two electrostriction boards stacked in layers, the actuator including an inside electrode disposed between the two electrostriction boards and two outside electrodes arranged outside the electrostriction boards; and means for supplying a driving voltage to the electrostriction actuator, the supply means for supplying the driving voltage to the inside voltage, applying a constant voltage not lower than the maximum value of the driving voltage to one of the outside electrodes, and applying a constant voltage not higher than the minimum value of the driving voltage to the other outside electrodes.

A displacement generating apparatus according to another aspect of the present invention comprises: an electrostriction actuator of a bimorph structure having M ($M \geq 2$) number of electrostriction boards stacked in layers, the actuator including (M+1) number of electrodes arranged outside and between the electrostriction boards; and means for supplying a driving voltage to the electrostriction actuator, the supply means supplying the driving voltage to the (N+2n)th-layer ($1 < N < M+1$; $n = 0, \pm 1, \pm 2, \ldots$) electrode, applying a constant voltage not lower than the maximum value of the driving voltage to the (N+1+2n)th-layer ($n = 0, 1, 2, \ldots$) electrode, and applying a constant voltage not higher than the minimum value of the driving voltage to the (N−1−2n)th- layer ($n = 0, 1, 2, \ldots$) electrode.

BRIEF DESCRIPTION OF THE DRAWINGS

FIG. 3 is a diagram showing the movement characteristic of an actuator of FIG. 1 with respect to applied voltage;

FIG. 4 is a diagram showing the displacement characteristic of an electrostriction material with respect to applied voltage;

DETAILED DESCRIPTION OF THE PREFERRED EMBODIMENTS

Preferred embodiments of the present invention will now be described in detail with reference to the accompanying drawings.

Figure 1:
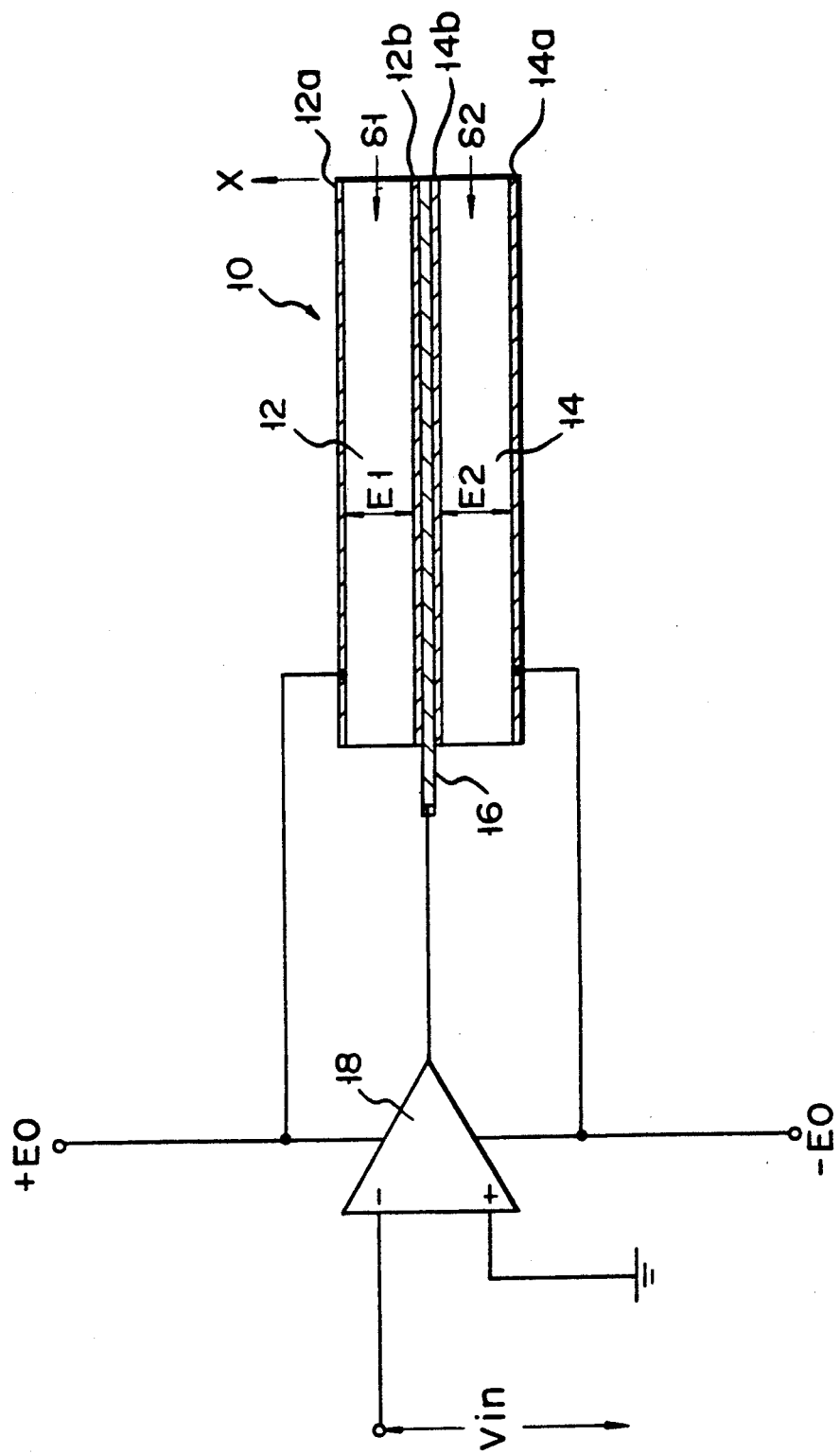
FIG. 1 shows a schematic view of a displacement generating apparatus according to one embodiment of the present invention.

FIG. 1 shows a schematic view of a displacement generating apparatus according to one embodiment of the invention. Bimorph-type electrostriction actuator 10 comprises upper and lower electrostriction boards 12 and 14 having electrodes 12a, 12b and 14a, 14b formed on either side thereof, respectively, by printing, and conductive shim 16 whose opposite sides are bonded individually to electrodes 12b and 14b. One end of actuator 10 is fixed, while the other end is a free end. Amplifier 18 for supplying driving voltage to actuator 10 is an inverted amplifier, whose output terminal is connected to shim 16. Outside electrode 12a of upper electrostriction board 12 is connected to a power source (not shown) for supplying constant voltage $+E_0$ to amplifier 18, and outside electrode 14a of lower electrostriction board 14 is connected to a power source (not shown) for supplying constant voltage $-E_0$ to amplifier 18.

Figure 2A:
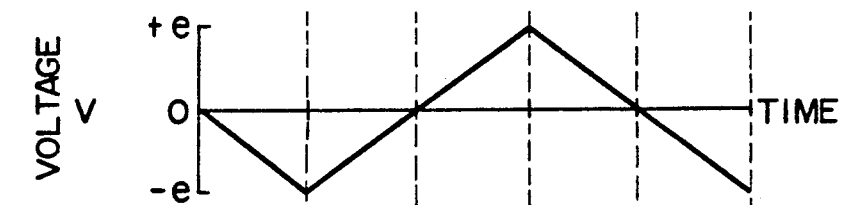
FIG. 2A is a time chart of input signal $V_{in}$ applied to an amplifier shown in FIG. 1.
Figure 2B:
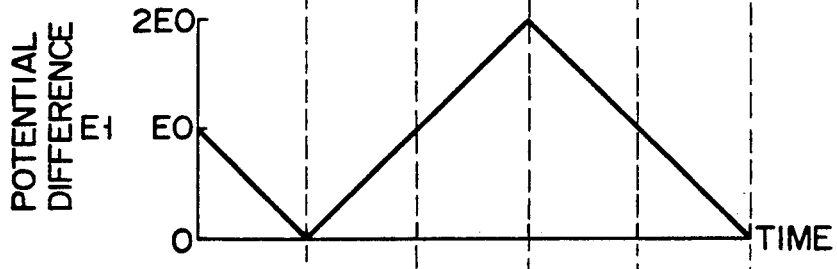
FIG. 2B is a time chart of potential difference E1 between outside and inside electrodes of an upper electrostriction board.
Figure 2C:
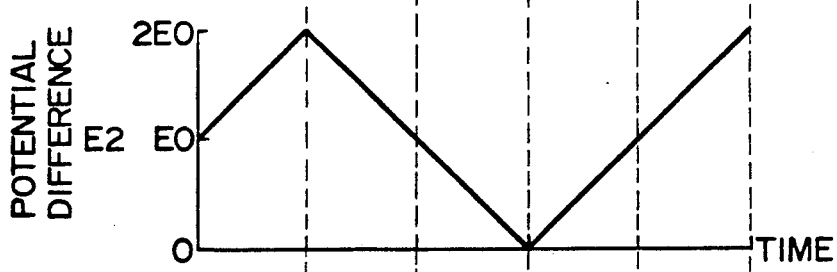
FIG. 2C is a time chart of potential difference E2 between outside and inside electrodes of a lower electrostriction board.
Figure 2D:
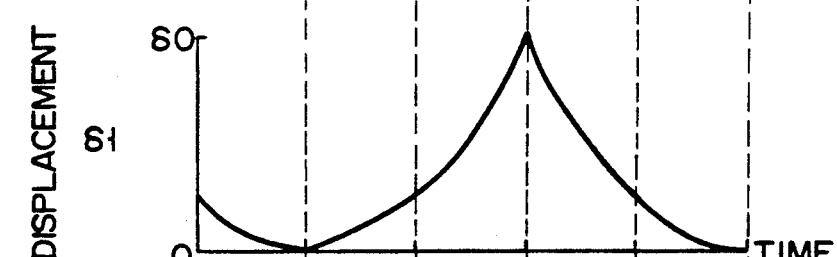
FIG. 2D is a time chart of displacement δ1 of the upper electrostriction board.
Figure 2E:
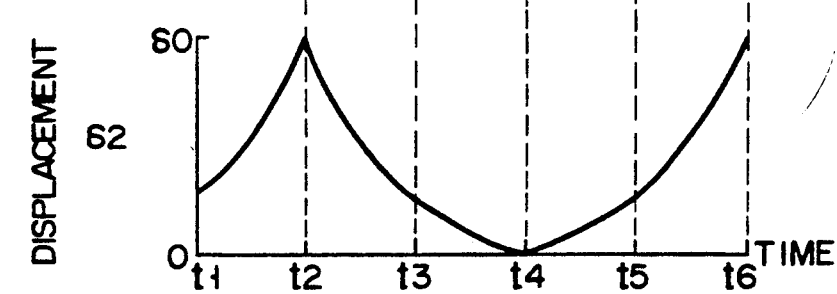
FIG. 2E is a time chart of displacement δ2 of the lower electrostriction board.

Referring now to the time charts of FIGS. 2A to 2E, the operation of bimorph-type electrostriction actuator 10 with the aforementioned construction will be described. Electrostriction boards 12 and 14 are displaced in proportion to the square of an electric field applied thereto, and the applied field is proportional to voltage applied to electrostriction boards 12 and 14. Accordingly, electrostriction boards 12 (or 14) are displaced in proportion to the square of the potential difference between their corresponding electrode pairs 12a and 12b (or 14a and 14b). As seen from FIG. 2A, the output of amplifier 18 in initial state t1 is 0, that is, the potential of shim 16 is 0. Thus, the potential difference between outside and inside electrodes 12a and 12b of upper electrostriction board 12 is $E_0$, as shown in FIG. 2B. Likewise, the potential difference between outside and inside electrodes 14a and 14b of lower electrostriction board 14 is $E_0$, as shown in FIG. 2C. Thus, two electrostriction boards 12 and 14 extend for the same length, as seen from FIGS. 2D and 2E, so that the distal end portion of actuator 10 is subject to no movement. When input signal $V_{in}$ goes low as time changes from t1 to t2, voltage applied to shim 16 rises (since amplifier 18 is an inverted amplifier). Thus, the potential difference between outside and inside electrodes 12a and 12b of upper electrostriction board 12 decreases from $E_0$ as the voltage of shim 16 rises. In contrast with this, the potential difference between outside and inside electrodes 14a and 14b of lower electrostriction board 14 increases from $E_0$ as the voltage of shim 16 rises. Thus, displacement $\delta 1$ of upper electrostriction board 12 decreases, while displacement $\delta 2$ of lower electrostriction board 14 increases. Accordingly, actuator 10 bends, so that its distal end portion moves upward. When time passes to t2, t3, ..., thereafter, the distal end portion of actuator 10 moves up and down, depending on the polarity of $V_{in}$. As shown in FIG. 3, movement x of the distal end portion of actuator 10 is linear. Potential differences between electrodes 12a and 12b, and between electrodes 14a and 14b both vary between 0 and $2E_0$.

Operation for bending movement of actuator 10 will now be described in detail. As shown in FIG. 4, electrostriction material is displaced in proportion to the square of the applied voltage. In the aforementioned operation, moreover, the voltage changes in proportion to time, so that displacements $\delta 1$ and $\delta 2$ of electrostriction boards 12 and 14 are given by $$\delta 1 = A(T-t2)^2, \text{ and}$$

$$\delta 2 = A(T+t2)^2,$$

respectively, where A is a proportional constant and T is time. It is known that bending movement x of the bimorph-type actuator is proportional to the difference in length between the two electrostriction boards. If the proportional constant for this case is B, movement x of actuator 10 is given by $$x = B|\delta 1 - \delta 2| = CT,$$

where we have $C = 4ABt2$. Since the voltage changes in proportion to time, as described before, bending movement x ultimately is given by $$x = DV,$$

where D is a proportional constant. As is evident from this equation, the relationship between bending movement x and voltage V is linear.

According to this embodiment, a circuit for driving actuator 10 is formed of only one amplifier, which leads to reduction in the apparatus size and manufacturing cost. The output of amplifier 18 is applied to electrodes 12b and 14b sandwiched between electrostriction boards 12 and 14, while constant voltages $+E_0$ and $-E_0$ supplied to amplifier 18 are applied to outside electrodes 12a and 14a of boards 12 and 14, respectively. By doing this, actuator 10 can be operated covering a wide range.

Figure 5:
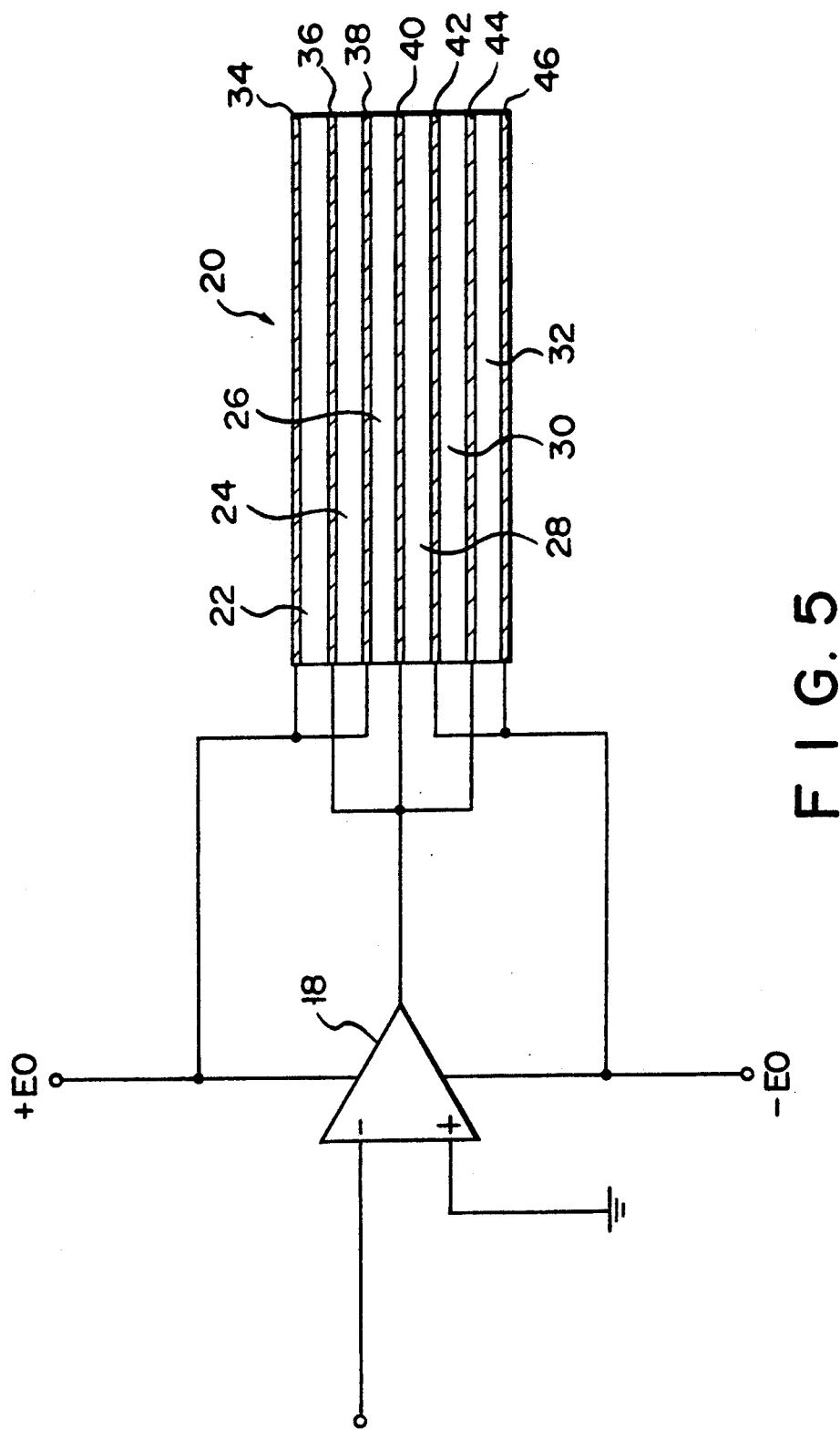
FIG. 5 shows a schematic view of a displacement generating apparatus according to another embodiment of the present invention.

Referring now to FIG. 5, another embodiment of the present invention will be described. Actuator 20 includes six electrostriction boards 22, 24, 26, 28, 30 and 32 stacked in layers, and seven electrodes 34, 36, 38, 40, 42, 44 and 46 arranged so as to sandwich the boards between them. The output voltage of amplifier 18 is applied to central electrode 40 and second- and sixth-layer electrodes 36 and 44. Maximum driving voltage $+E_0$ is applied to top- and third-layer electrodes 34 and 38, while minimum driving voltage $-E_0$ is applied to fifth- and bottom-layer electrodes 42 and 46.

Actuator 20 according to this embodiment, like actuator 10 of the foregoing embodiment, has no hysteresis in its bending movement, and moves linearly with respect to the applied voltage. According to this second embodiment, moreover, the same effect of the first embodiment can be obtained, and the actuator has a multilayer structure. If the individual electrostriction boards of the two embodiments have the same thickness, therefore, the actuator of the second embodiment can produce a greater force than the actuator of the first embodiment. If the respective actuators of the two embodiments have the same overall thickness, the structure of the second embodiment, compared with the first embodiment, can enjoy the same movement at a lower voltage.

The present invention is not limited to the embodiments described above. For example, any number of electrostriction boards may be stacked, and the number of layers need not always be an even number. Further, the electrode to which the output voltage of the amplifier is applied need not always be situated just in the center of the actuator. Although an operational amplifier is used as the inverted amplifier in the aforementioned embodiments, moreover, the present invention is not limited to the arrangement using the operational amplifier or inverted amplifier. In the embodiments described herein, furthermore, the same power supply for the operational amplifier is used as means for applying constant voltage to the actuator. Alternatively, however, a separate constant-voltage power source may be provided for this purpose with the same result. It is to be understood that the present invention is not limited to the embodiment described above, and that various changes and modifications may be effected therein by one skilled in the art without departing from the scope or spirit of the invention.

What is claimed is:

1. A displacement generating apparatus comprising:
    an electrostriction actuator of a bimorph structure having two electrostriction boards stacked in layers, said actuator including an inside electrode disposed between the two electrostriction boards and two outside electrodes arranged outside the electrostriction boards; and
    means for supplying a variable driving voltage to the electrostriction actuator, said supply means supplying the driving voltage to the inside electrode, applying a constant voltage not lower than the maximum value of the driving voltage to one of the outside electrodes, and applying a constant voltage not higher than the minimum value of the driving voltage to the other outside electrodes;

wherein said electrostriction boards produce a positive displacement with respect to an applied voltage of either polarity.

2. A displacement generating apparatus comprising:

an electrostriction actuator of a bimorph structure having $M (M \geq 2)$ number of electrostriction boards stacked in layers, said actuator including $(M+1)$ number of electrodes arranged outside and between the electrostriction boards; and means for supplying a variable driving voltage to the electrostriction actuator, said supply means supplying the driving voltage to the $(N+2n)$th-layer $(1 < N < M+1; n = 0, \pm 1, \pm 2, \ldots)$ electrode, applying a constant voltage not lower than the maximum value of the driving voltage to the $(N+1+2n)$th-layer $(N=0, 1, 2, \ldots)$ electrode, and applying a constant voltage not higher than the minimum value of the driving voltage to the $(N-1-2n)$th-layer $(n=0, 1, 2, \ldots)$ electrode;

wherein said electrostriction boards produce a positive displacement with respect to an applied voltage of either polarity.

3. The apparatus according to claim 2, wherein said N is given by $N = M/2$ where M is an even number, and is given by $N = (M \pm 1)/2$ where M is an odd number.

4. The apparatus according to claim 1, wherein said constant voltages not lower than the maximum value and not higher than the minimum value are equal to a constant voltage supplied to the supply means.

5. The apparatus according to claim 2, wherein said constant voltages not lower than the maximum value and not higher than the minimum value are equal to a constant voltage supplied to the supply means.

* * * * *